US006649495B2

(12) United States Patent
Shioya et al.

(10) Patent No.: US 6,649,495 B2
(45) Date of Patent: Nov. 18, 2003

(54) MANUFACTURING METHOD OF SEMICONDUCTOR DEVICE

(75) Inventors: Yoshimi Shioya, Tokyo (JP); Yuhko Nishimoto, Tokyo (JP); Tomomi Suzuki, Tokyo (JP); Hiroshi Ikakura, Tokyo (JP); Kazuo Maeda, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 10/164,709

(22) Filed: Jun. 10, 2002

(65) Prior Publication Data

US 2003/0022468 A1 Jan. 30, 2003

(30) Foreign Application Priority Data

Jul. 19, 2001 (JP) .......................................... 2001-220231

(51) Int. Cl.$^7$ .......................... H01L 21/20; H01L 21/36; C30B 1/00
(52) U.S. Cl. ........................ 438/485; 438/765; 438/798
(58) Field of Search ................................. 438/485, 573, 438/707, 711, 762, 765, 798, 935

(56) References Cited

U.S. PATENT DOCUMENTS

| 5,040,046 | A | 8/1991 | Chhabra et al. ............... 357/54 |
|---|---|---|---|
| 5,314,724 | A | 5/1994 | Tsukune et al. ............ 427/489 |
| 5,593,741 | A | 1/1997 | Ikeda ......................... 427/579 |
| 6,287,990 | B1 * | 9/2001 | Cheung et al. |
| 6,346,302 | B2 | 2/2002 | Kishimoto et al. ......... 427/569 |

OTHER PUBLICATIONS

"Device Electronics for Integrated Circuits", Second Edition, Richard S. Muller et al., 1977, pp. 102–103.
"Properties and Integration of Low k (k<3.0) PECVD films", Shi, et al., Novellus Systems, Inc., pp. 1–5.
"Development of Kow–k Copper Barrier Films Deposited by PE–CVD using HMDSO, N2O and NH3", T. Ishimaru, et al, Canon Sales Co., Inc., Semiconductor Process Laboratory Co., Ltd, Japan, 2001, pp. 36–38.
"Deposition of Low–K Dielectric Films Using Trimethylsilane", M. J. Loboda, et al, Dow Corning Corporation, Midland, Michigan, pp. 1–3.

\* cited by examiner

*Primary Examiner*—Phuc T. Dang
(74) *Attorney, Agent, or Firm*—Lorusso, Loud & Kelly

(57) ABSTRACT

The present invention relates to a manufacturing method of a semiconductor device in which a barrier insulating film and a main insulating film having low relative dielectric constant are sequentially formed while a wiring mainly consisting of copper film is coated. Its constitution includes the steps of: forming the barrier insulating film 35a on a substrate 21 subject to deposition, in which an electric power having a first frequency (f1) is applied to a first film forming gas containing at least silicon-containing gas and oxygen-containing gas to transform said first film forming gas into plasma and to cause reaction; and forming the main insulating film 35b having low relative dielectric constant on the barrier insulating film 35a, in which an electric power having a second frequency (f2) higher than the first frequency (f1) is applied to a second film forming gas containing at least the silicon-containing gas and the oxygen-containing gas to transform the second film forming gas into plasma and to cause reaction.

11 Claims, 8 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device, in which a barrier insulating film and a main insulating film having low relative dielectric constant are sequentially formed to coat a wiring consisting mainly of copper film.

2. Description of the Prior Art

In recent years, a higher data transfer speed has been required in addition to higher integration of a semiconductor integrated circuit device. For this reason, it has been provided with an insulating film having low relative dielectric constant and thereby small R-C delay (hereinafter, referred to as a low relative dielectric constant insulating film).

In order to form such a low relative dielectric constant insulating film, there is known a plasma enhanced CVD method using trimethylsilane ($SiH(CH_3)_3$) and $N_2O$. For example, the method is described in Electrochem. Soc. Fall Meeting Abstacts, p.344(1998) by M. J. Loboda, J. A. Seifferly, R. F. Schneider, and C. M. Grove, or the like. Further, a plasma enhanced CVD method using tetramethylsilane ($Si(CH_3)_4$) and $N_2O$ is described in SEMICON Korea Technical Symposium 2000, p.279(2000), or the like by J. Shi, M. A -Plano, T. Mountsier, and S. Nag, for example.

There is known a plasma enhanced CVD method using phenylsilane or the like as another method. It is described in The 46th Spring meeting of The Japan Society of Applied Physics (1999), p.897 by Kazuhiko Endo, Keisuke Shinoda, and Toru Tatsumi, The 60th Autumn meeting of The Japan Society of Applied Physics(1999), 1p-AN-9(1999) by Nobuo Matsushita, Yoshinori Morisada, Yuichi Naito, and Karyo Matsuno, The 4th Spring meeting of The Japan Society of Applied Physics (1999), p.897(1999) by Yukinori Uchida, Tsuneo Matsuzawa, Satoshi Kanno, and Masakiyo Matsumura, or the like.

When such insulating films with low relative dielectric constant are formed on the wiring consisting mainly of copper film, the barrier insulating film made of nitride film is firstly formed on the wiring consisting mainly of copper film to prevent copper from diffusing, and the insulating film with low relative dielectric constant is formed on the barrier insulating film.

In this case, when forming the barrier insulating film made of nitride film and the main insulating film having low relative dielectric constant are formed on the wiring consisting mainly of copper film by the CVD method, the nitride film is formed by nitrogen-containing gas first, and the gas is then switched to silicon-containing gas to form the insulating film having low relative dielectric constant. Gas flow rate or the like as well is appropriately adjusted along with switching of film forming gas. As described above, when the barrier insulating film and the main insulating film are sequentially formed on the wiring consisting mainly of copper film, there is a need for switching operation of gas, adjusting operation of the gas flow rate, and the like. Moreover, since much time is required to substitute the film forming gas inside a chamber after switching of gas, throughput is not improved.

SUMMARY OF THE INVENTION

The object of the present invention is to provide a manufacturing method of a semiconductor device, which is capable of forming the barrier insulating film having sufficient ability for preventing diffusion of copper and the main insulating film having sufficiently low relative dielectric constant while improving throughput, when the barrier insulating film and the main insulating film thereon are sequentially formed on the wiring consisting mainly of copper film.

Incidentally, when the film forming gas including silicon-containing gas and oxygen-containing gas is transformed into plasma by an electric power having low frequency of 1 MHz or less, 380 kHz for example, to cause reaction to form a film, and thus a dense insulating film can be formed. Accordingly, diffusion of copper can be prevented. Further, when the film forming gas is transformed into plasma by the electric power having high frequency of 1 MHz or more, 13.56 MHz for example, to cause reaction to form a film, the main insulating film having low relative dielectric constant can be formed. This is due to the reason as follows. Ions and the like are easily accelerated due to a large cathode drop voltage in the low frequency, and the film is densely formed by a so-called bombardment effect. On the other hand, the so-called bombardment effect is small in the high frequency since the cathode drop voltage is small. Thus, the film has low relative dielectric constant although denseness is lower comparing to that of the low frequency. In those events, the insulating films having the foregoing different capabilities can be formed while the same film forming gas is used in deposition.

In the present invention, substantially same gases which respectively contain the silicon-containing gas and the oxygen containing gas are used as the first and second film forming gases to form the barrier insulating film and the main insulating film having low relative dielectric constant. Specifically, the electric power having a first frequency f1 is applied to the first film forming gas to transform it into plasma, and the barrier insulating film is thus formed. And, the electric power having a second frequency f2 higher than the first frequency f1 is applied to the second film forming gas to transform it into plasma, and the main insulating film having low relative dielectric constant is thus formed. For example, the first frequency f1 is set to the frequency of 100 kHz or more and 1 MHz or less, and the second frequency f2 is set to the frequency of 1 MHz or more.

Therefore, multi-layer insulating films which have ability required for an inter wiring layer insulating film can be continuously formed on the wiring or the like mainly consisting of copper film by using the substantially same gases as the first and second film forming gases and only adjusting the frequency of the electric power for transforming the film forming gas into plasma. Accordingly, improvement of throughput can be achieved.

Any one of combinations of alkyl compound having siloxane bond with $N_2O$, $H_2O$ or $CO_2$ can be used as a preferable combination of the silicon-containing gas and the oxygen-containing gas.

Furthermore, if gas in which any one of nitrogen-containing gases such as ammonia ($NH_3$) and nitrogen ($N_2$) in particular is added to the silicon-containing gas and the oxygen-containing gas is used as the first film forming gas for forming the barrier insulating film, barrier ability against copper can be improved for a deposited insulating film. Moreover, if gas in which any one of methylcyclohexane ($CH_3C_6H_{11}$) and cyclohexane ($C_6H_{12}$) in particular is added to the silicon-containing gas and the oxygen-containing gas is used as the second film forming gas for forming the main insulating film, lower relative dielectric constant can be achieved for a deposited insulating film.

Alternatively, using inert gas such as helium (He), argon (Ar) or nitrogen ($N_2$) can dilute the film forming gas without resulting in spoiling adhesion between the wiring consisting mainly of copper film and the barrier insulating film.

DESCRIPTION OF THE PREFERRED EMBODIMENTS

Embodiments of the present invention will be described with reference to the drawings.

First Embodiment

Figure 1:
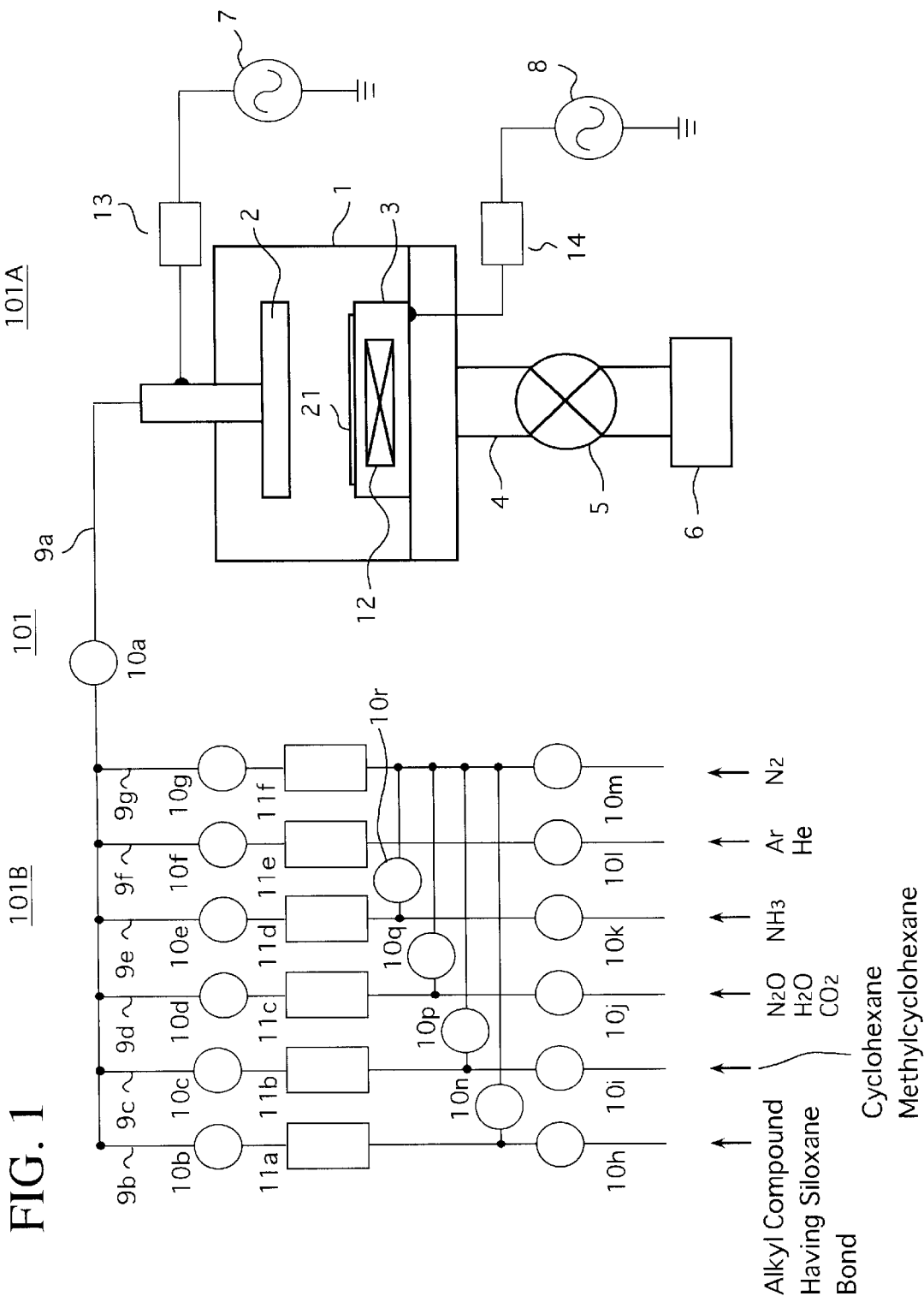
FIG. 1 is a side view showing a structure of a plasma enhanced deposition apparatus used in a manufacturing method of a semiconductor device, according to an embodiment of the present invention.

FIG. 1 is the side view showing the structure of a diode parallel plate plasma enhanced CVD apparatus 101 used in the manufacturing method of the semiconductor device according to the embodiment of the present invention.

The plasma enhanced CVD apparatus 101 is provided with: a deposition section 101A that is a position where the insulating film is formed on a substrate 21 subject to deposition by plasma gas; and a film forming gas supply section 101B having a plurality of supply sources of gases that constitute the film forming gas.

The deposition section 101A includes a decompressive chamber 1 as shown in FIG. 1, and the chamber 1 is connected with an exhaust unit 6 via an exhaust piping 4. A switching valve 5 that controls communication/non-communication between the chamber 1 and the exhaust unit 6 is provided halfway the exhaust piping 4. The chamber 1 is provided with pressure measurement means such as a vacuum gauge (not shown) for monitoring a pressure inside the chamber 1.

A pair of an upper electrode (second electrode) 2 and a lower electrode (first electrode) 3, which oppose to each other, are provided in the chamber 1. A low frequency electric power supply source 8 that supplies the low frequency electric power of the first frequency (f1) of 100 kHz or more and 1 MHz or less, for example, 380 kHz in this embodiment, is connected to the lower electrode 3. On the other hand, a high frequency electric power supply source (RF power supply source) 7 that supplies the high frequency electric power of the second frequency (f2) higher than the first frequency (f1) of 1 MHz or more, for example, 13.56 MHz in this embodiment, is connected to the upper electrode 2. These power supply sources (7, 8) supply electric power to the upper electrode 2 and the lower electrode 3 to transform the film forming gas into plasma. The upper electrode 2, the lower electrode 3 and the power supply sources (7, 8) constitute plasma generation means that transforms the film forming gas into plasma.

The upper electrode 2 also serves as a dispersion unit of the film forming gas. A plurality of through holes are formed on the upper electrode 2, and openings of the through holes on the opposing surface of the upper electrode 2 to the lower electrode 3 function as discharge ports (introduction ports) of the film forming gas. The discharge ports for the film forming gas or the like are connected with the film forming gas supply section 101B by a piping 9a. Further, there are cases where a heater (not shown) is provided for the upper electrode 2. This is because heating the upper electrode 2 to about 100° C. to 200° C. during deposition prevents particles made of reaction product of the film forming gas or the like from adhering to the upper electrode 2.

The lower electrode 3 also serves as a holding stage for the substrate 21 subject to deposition, and it includes a heater 12 that heats the substrate subject to deposition 21 on the holding stage.

The film forming gas supply section 101B is provided with: a supply source of alkyl compound having siloxane bond; a supply source of any one of cyclohexane ($C_6H_{12}$) and methylcyclohexane ($CH_3C_6H_{11}$); a supply source of oxygen-containing gas; a supply source of ammonia ($NH_3$); a supply source of dilute gas; and a supply source of nitrogen ($N_2$).

These gases are appropriately supplied into the chamber 1 of the deposition section 101A through branch piping (9b to 9g) and the piping 9a where all the branch piping (9b to 9g) is connected. Flow rate adjustment means (11a to 11f) and switching means (10b to 10m) that control communication/non-communication of the branch piping (9b to 9g) are installed halfway the branch piping (9b to 9g). Further, switching means 10a that controls communication/non-communication of the piping 9a is provided halfway the piping 9a.

Furthermore, switching means (10n, 10p to 10r), which control communication/non-communication between the branch piping 9g connected to the supply source of nitrogen ($N_2$) gas and other branch piping (9b to 9e), are installed in order to purge residual gas in the branch piping (9b to 9e) by flowing the nitrogen ($N_2$) gas. Note that the nitrogen ($N_2$) gas also purges residual gas in the piping 9a and the chamber 1 in addition to the branch piping (9b to 9e). The nitrogen ($N_2$) gas is sometimes used as the dilute gas as well.

The foregoing deposition apparatus 101 is provided with a supply source of silicon-containing compound and a supply source of the oxygen-containing gas as the supply source of the film forming gas. Moreover, the system 101 also includes the lower electrode 3, the low frequency electric power supply source 8 that supplies a low frequency electric power with the first frequency (f1) of 100 kHz or more and 1 MHz or less, the upper electrode 2, and the high frequency electric power supply source 7 that supplies a high frequency electric power with the second frequency (f2) higher than the first frequency (f1) of 1 MHz or more, as the plasma generation means that transforms the film forming gas into plasma.

With this configuration, the plasma enhanced CVD method can form the insulating film having low relative dielectric constant, high adhesion with copper wiring and improved barrier ability as shown in the following embodiments.

Following is a method of applying the electric power to the upper electrode 2 and the lower electrode 3 for forming the barrier insulating film and the main insulating film.

Specifically, in a forming process of the barrier insulating film, the low frequency electric power having the first frequency (f1) of 100 kHz or more and 1 MHz or less is applied only to the lower electrode 3. And, in a forming process of the main insulating film having low relative dielectric constant, the high frequency electric power having the second frequency (f2) higher than the first frequency (f1) of 1 MHz or more is applied only to the upper electrode 2.

Next, gas shown below can be used as a typical example of the alkyl compound having siloxane bond as the film forming gas which is applied to the present invention, the oxygen-containing gas and the dilute gas.

(i) Alkyl Compound Having Siloxane Bond

Hexamethyldisiloxane (HMDSO:$(CH_3)_3Si—O—Si(CH_3)_3$) Octamethylcyclotetrasiloxane (OMCTS: $((CH_3)_2)_4Si_4O_4$)

[Chemical formula 1]

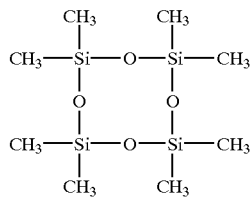

Tetramethylcyclotetrasiloxane (TMCTS: $(CH_3H)_4Si_4O_4$)

[Chemical formula 2]

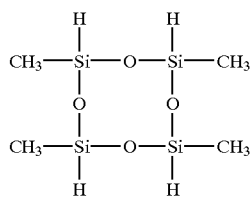

(ii) Nitrogen-Containing Gas

Nitrogen monoxide ($N_2O$)

Water ($H_2O$)

Carbonic acid gas ($CO_2$)

(iii) Dilute Gas

Helium (He)

Argon (Ar)

Nitrogen ($N_2$)

Next, experiment performed by the inventor will be described.

A silicon oxide film was deposited on an Si substrate by a plasma enhanced CVD method (PECVD method) under the following deposition conditions. There were used HMDSO (hexamethyldisiloxane) as the alkyl compound having siloxane bond, $N_2O$ (nitrogen monoxide) as the oxygen-containing gas, and He (helium) as the dilute gas, respectively. Note that one minute and thirty seconds are reserved for time (stabilization period) necessary for substituting gas inside the chamber from gas introduction to start of deposition (plasma excitation) prior to deposition. Further, the upper electrode 2 is heated to 100° C. to prevent the reaction product from adhering to the upper electrode 2.

Deposition Conditions (i) Film forming gas

HMDSO flow rate: 50 SCCM $N_2O$ flow rate (parameter): 50, 200, 400, 800 SCCM

Gas pressure (parameter): 0.3, 0.5, 0.7, 0.8, 0.9, 1.0 Torr (ii) Plasma excitation conditions Lower electrode (first electrode)

Low frequency electric power (frequency: 380 kHz): 150 W

Upper electrode (second electrode)

High frequency electric power (frequency: 13.56 MHz): 250 W (iii) Substrate heating conditions: 375° C.

Figure 4:
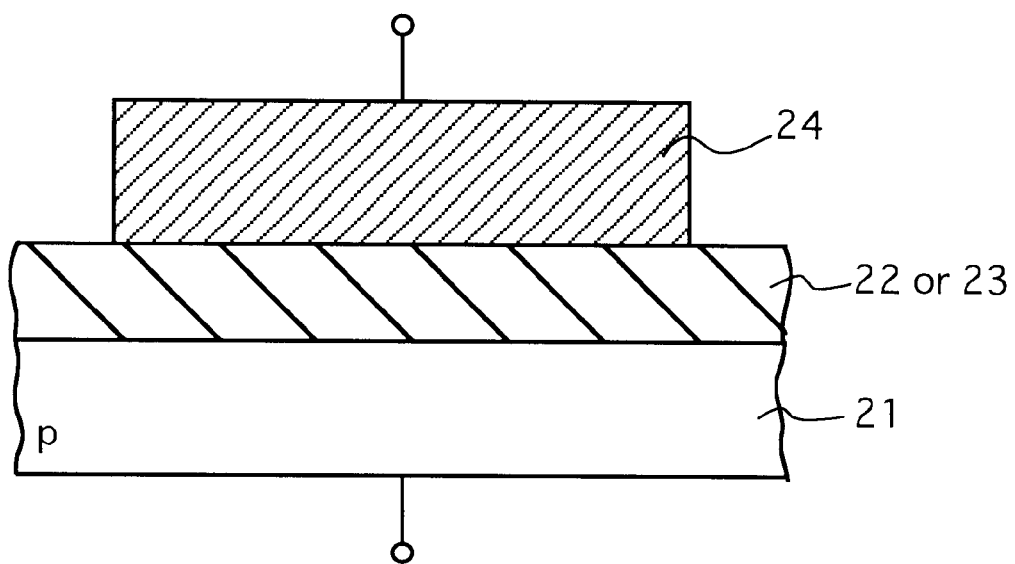
FIG. 4 is a cross-sectional view showing a sample for investigating characteristics of the insulating film which is deposited by the deposition method of the first embodiment of the present invention.

FIG. 4 is the cross-sectional view showing the sample for investigation. In the drawing, reference numeral 21 denotes the Si substrate as the substrate subject to deposition, 22: a PE-CVD $SiO_2$ film formed by the deposition method of the present invention in which the low frequency electric power transforms the film forming gas into plasma, 23: a PE-CVD $SiO_2$ film formed by the deposition method of the present invention in which the high frequency electric power transforms the film forming gas into plasma, and 24: an electrode which a mercury probe serves as. The contact area between the electrode 24 and the PE-CVD $SiO_2$ film (22 or 23) is 0.0230 cm².

(a) Relationships of Relative Dielectric Constant and Refractivity of Deposition with $N_2O$ Flow Rate in the Film Forming Gas FIG. 4 shows the sample for test having the PE-CVD $SiO_2$ film 22 as the insulating film for test used in the investigation. The insulating film 22 for test was deposited under the four conditions of the $N_2O$ flow rate at 50, 200, 400, 800 sccm and one condition of the low frequency electric power at 150 W of the frequency of 380 kHz applied to the lower electrode 3 among the parameters of the foregoing deposition conditions. The high frequency electric power is not applied to the upper electrode 2. The gas pressure as another parameter is set to a constant value of 1.0 Torr.

Figure 2:
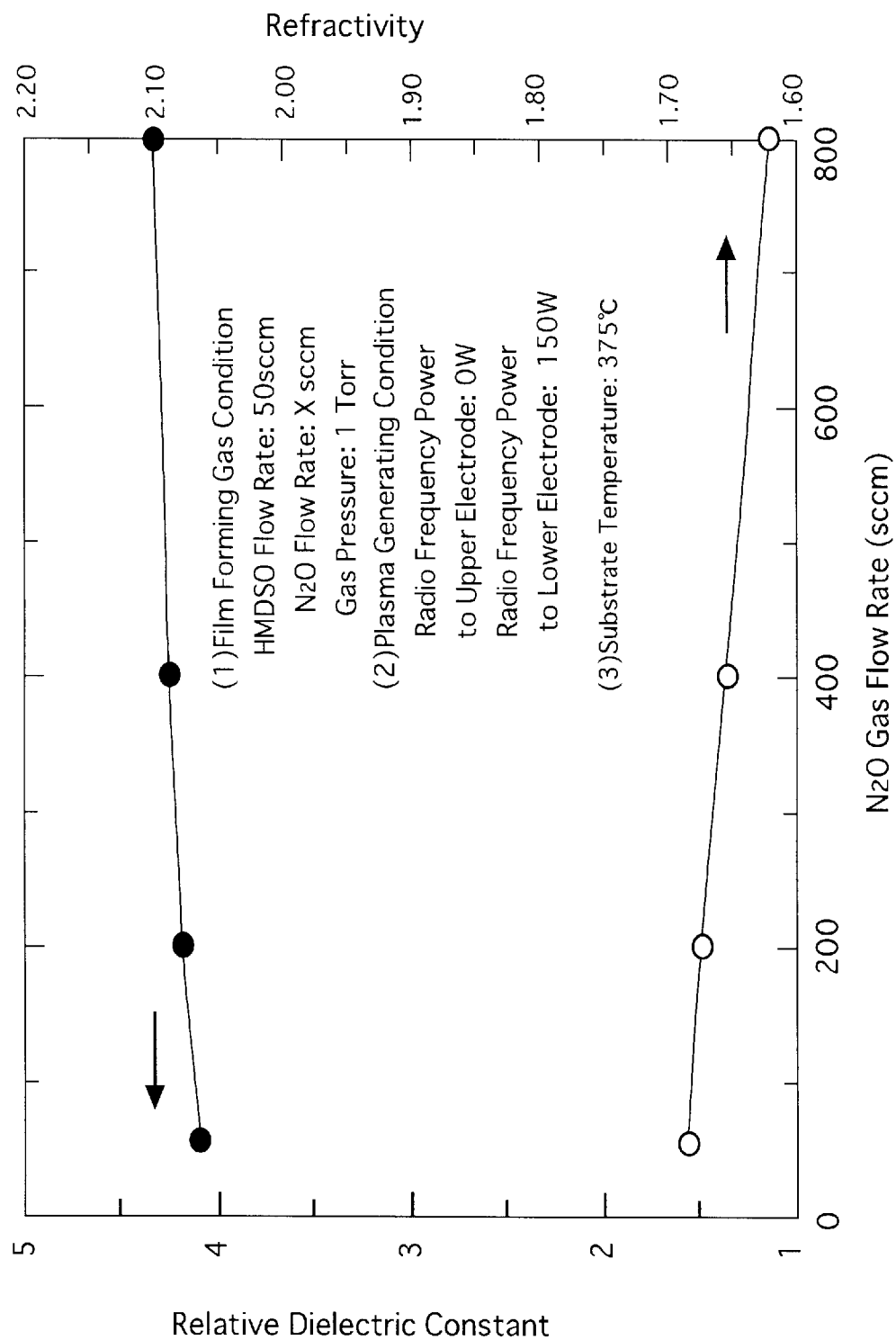
FIG. 2 is a graph showing a relationship of relative dielectric constant and refractivity of a deposited insulating film with $N_2O$ flow rate in a deposition method using a plasma enhanced CVD by a low frequency electric power, according to a first embodiment of the present invention.

FIG. 2 is the view showing the relationships of relative dielectric constant and refractivity of the PE-CVD $SiO_2$ film 22 formed on the Si substrate 21 with the $N_2O$ flow rate (sccm) in the film forming gas when the low frequency electric power is applied to the lower electrode 3. The left axis of ordinate shows the relative dielectric constant of the PE-CVD $SiO_2$ film 22, which is expressed in a linear scale, and the right axis of ordinate shows the refractivity of the PE-CVD $SiO_2$ film 22, which is expressed in the linear scale. The axis of abscissas shows the $N_2O$ flow rate (sccm) expressed in the linear scale.

The relative dielectric constant was calculated from a capacitance value of the PE-CVD $SiO_2$ film 22 measured by a C-V measurement method. The C-V measurement was performed by applying a DC voltage between the Si substrate 21 and the electrode 24 and superposing a signal having a frequency of 1 MHz to the DC voltage. Further, the refractivity was measured on an ellipsometer using He—Ne laser that has 6338 angstrom.

According to FIG. 2, the relative dielectric constant gradually increases from about 4 to about 4.3 with an increase of the $N_2O$ flow rate in the entire test range of the $N_2O$ flow rate from 50 to 800 sccm. The refractivity is about 1.68 when the $N_2O$ flow rate is at 50 sccm, and thereafter it gradually reduces with an increase of the $N_2O$ flow rate, and thus is about 1.62 when the $N_2O$ flow rate is at 800 sccm. Note that the higher the refractivity of the PE-CVD $SiO_2$ film 22, the denser the PE-CVD $SiO_2$ film 22.

(b) Relationships of Relative Dielectric Constant and Refractivity of Deposition With Gas Pressure FIG. 4 shows the sample for test having the PE-CVD $SiO_2$ film 23 as the insulating film for test used in the investigation. The insulating film 23 for test was deposited under the six conditions of the gas pressure of the film forming gas at 0.3, 0.5, 0.7, 0.8, 0.9, 1.0 Torr and one condition of the high frequency electric power at 250 W of the frequency of 13.56 MHz applied to the upper electrode 2 among the parameters of the foregoing deposition conditions. The low frequency electric power is not applied to the lower electrode 3. The $N_2O$ flow rate as another parameter is set to a constant value of 200 sccm.

Figure 3:
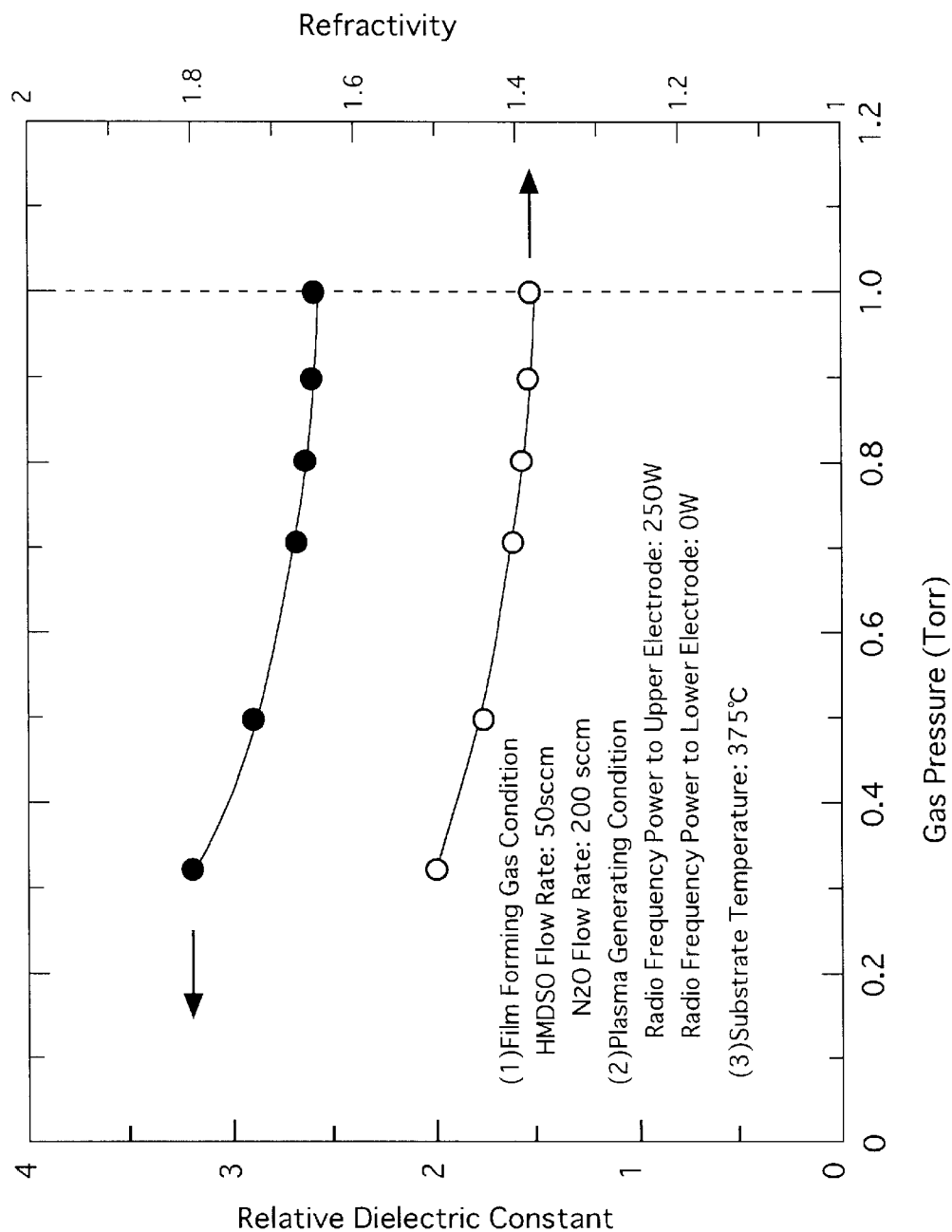
FIG. 3 is a graph showing a relationship of relative dielectric constant and refractivity of a deposited insulating film with gas pressure in the deposition method using the plasma enhanced CVD by a high frequency electric power, according to the first embodiment of the present invention.

FIG. 3 is the view showing the relationships of relative dielectric constant and refractivity of the PE-CVD $SiO_2$ film 23 formed on the Si substrate 21 with the gas pressure when the high frequency electric power is applied to the upper electrode 2. The left axis of ordinate shows the relative dielectric constant of the PE-CVD $SiO_2$ film 23, which is expressed in the linear scale, and the right axis of ordinate shows the refractivity of the PE-CVD $SiO_2$ film 23, which is expressed in the linear scale. The axis of abscissas shows the gas pressure (Torr) of the film forming gas in the chamber 1, which is expressed in the linear scale.

The relative dielectric constant and the refractivity were measured in the same manner as the foregoing item (a).

According to FIG. 3, the relative dielectric constant is 3.2 when the gas pressure is at 0.3 Torr and thereafter it gradually reduces as the gas pressure increases, and thus it is about 2.6 when the gas pressure is at 1.0 Torr. The refractivity is about 1.5 when the gas pressure is at 0.3 Torr and thereafter it gradually reduces as the gas pressure increases, and thus it is 1.39 when the gas pressure is at 1.0 Torr.

As shown in the experimental result, the denser PE-CVD $SiO_2$ film 23 could be formed when plasma of the film forming gas formed by the low frequency electric power was used. On the other hand, when plasma of the film forming gas formed by the high frequency electric power was used, the PE-CVD $SiO_2$ film 23 having the low relative dielectric constant could be formed. The following reason is estimated. Specifically, ions and the like are easily accelerated due to the large cathode drop voltage in the low frequency, and thus the film is densely formed by the so-called bombardment effect. On the other hand, the so-called bombardment effect is small in the high frequency since the cathode drop voltage is small. Thus, the film has low relative dielectric constant although density is lower comparing to that by the low frequency.

(c) Leakage Current Density of Film

Description will be made for the measurement result of the leakage current density of the film before and after annealing, which was performed to investigate barrier ability to copper, that is, the denseness of the film.

The PE-CVD $SiO_2$ film having the film thickness of about 100 nm was laminated on a Cu film by using mixed gas of $HMDSO+N_2O$ as the first film forming gas according to the present invention, the electrode was further formed on a PE-CVD SiOCHN film, and thus the sample 1 for test was fabricated. The insulating film for test was deposited based on three conditions of the $N_2O$ flow rate of 0, 200, 800 sccm and one condition of the low frequency electric power of 150 W at the frequency of 380 kHz applied to the lower electrode 3 among the parameters of the foregoing deposition conditions. The high frequency electric power is not applied to the upper electrode 2. The gas pressure as another parameter is set to a constant value of 1.0 Torr.

A sample 2 for test, on which the PE-CVD SiOCHN film having the film thickness of about 100 nm was laminated, was fabricated by a PE-CVD method using $HMDSO+N_2O+NH_3$ instead of using $HMDSO+N_2O$ as the first film forming gas. The insulating film for test was deposited based on the constant $N_2O$ flow rate of 200 sccm and one condition of the low frequency electric power of 150 W at the frequency of 380 kHz applied to the lower electrode 3 among the parameters of the foregoing deposition conditions. The high frequency electric power is not applied to the upper electrode 2. The conditions for a newly added $NH_3$ flow rate were set to 0, 200, 600 sccm.

A comparative sample 1, on which a PE-CVD SiN film having the film thickness of about 100 nm was deposited by the PE-CVD method using mixed gas of $HMDSO+NH_3$, was fabricated. The insulating film for comparison was deposited based on the constant $N_2O$ flow rate of 0 sccm and one condition of the low frequency electric power of 150 W at the frequency of 380 kHz applied to the lower electrode 3 among the parameters of the foregoing deposition conditions. The high frequency electric power is not applied to the upper electrode 2. The conditions for the $NH_3$ flow rate were set to 0, 50, 100, 200, 400, 600 sccm.

Furthermore, a comparative sample 2, on which a silicon nitride film (p-SiN film) was deposited by the plasma enhanced CVD method, was also fabricated.

The leakage current densities were measured with regard to the samples for test and the comparative samples immediately after deposition and after annealing (four hours in nitrogen at 450° C.) as in the following manner. Specifically, a voltage was applied between the copper film and the electrode to measure the leakage current density flowing between the copper film and the electrode. The copper film was grounded and a negative voltage was applied to the electrode.

Figure 5:
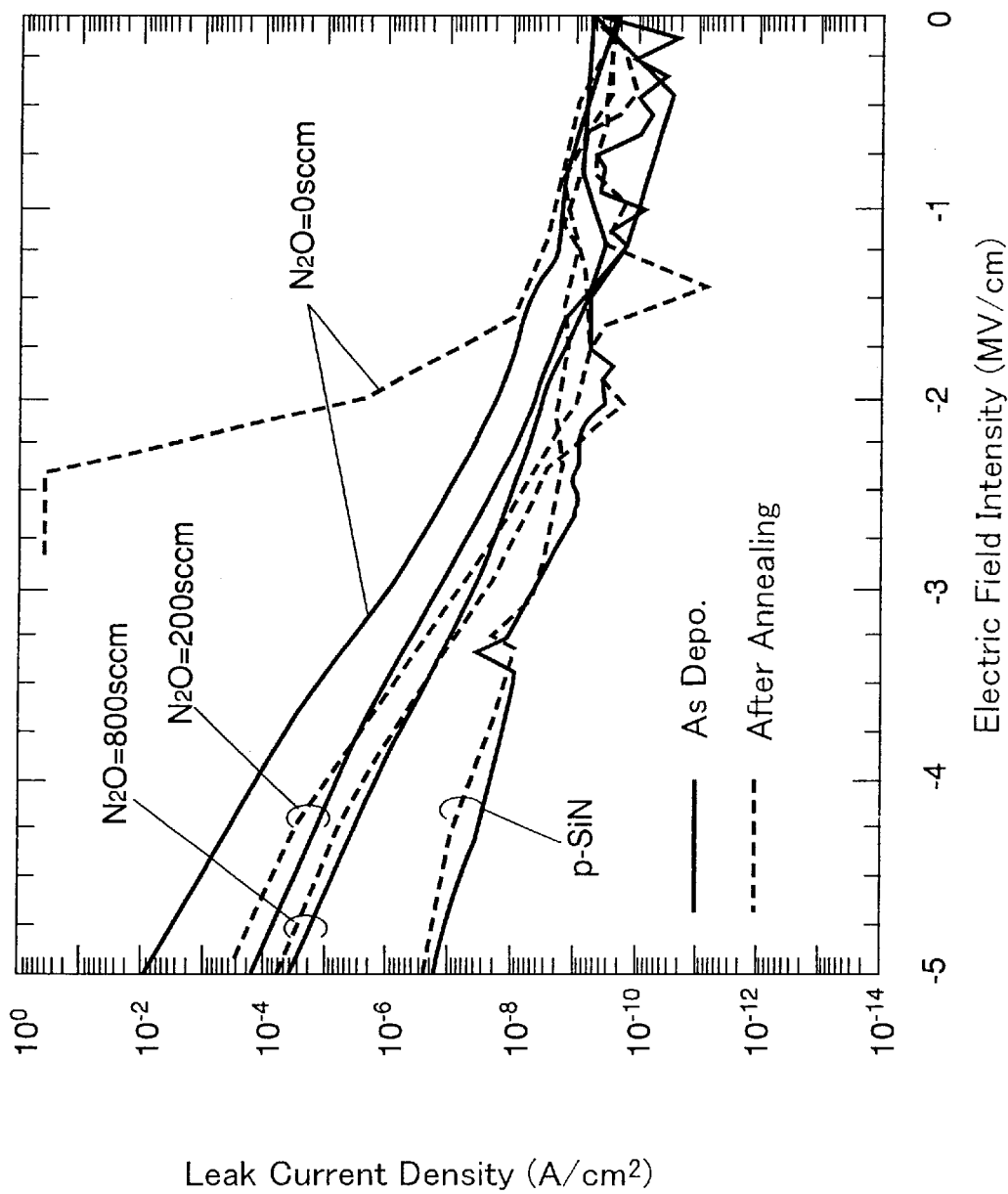
FIG. 5 is a graph showing comparison of leakage current densities immediate after deposition and after annealing with regard to the insulating film formed by the plasma enhanced CVD method using film forming gas, according to the first embodiment of the present invention.
Figure 6:
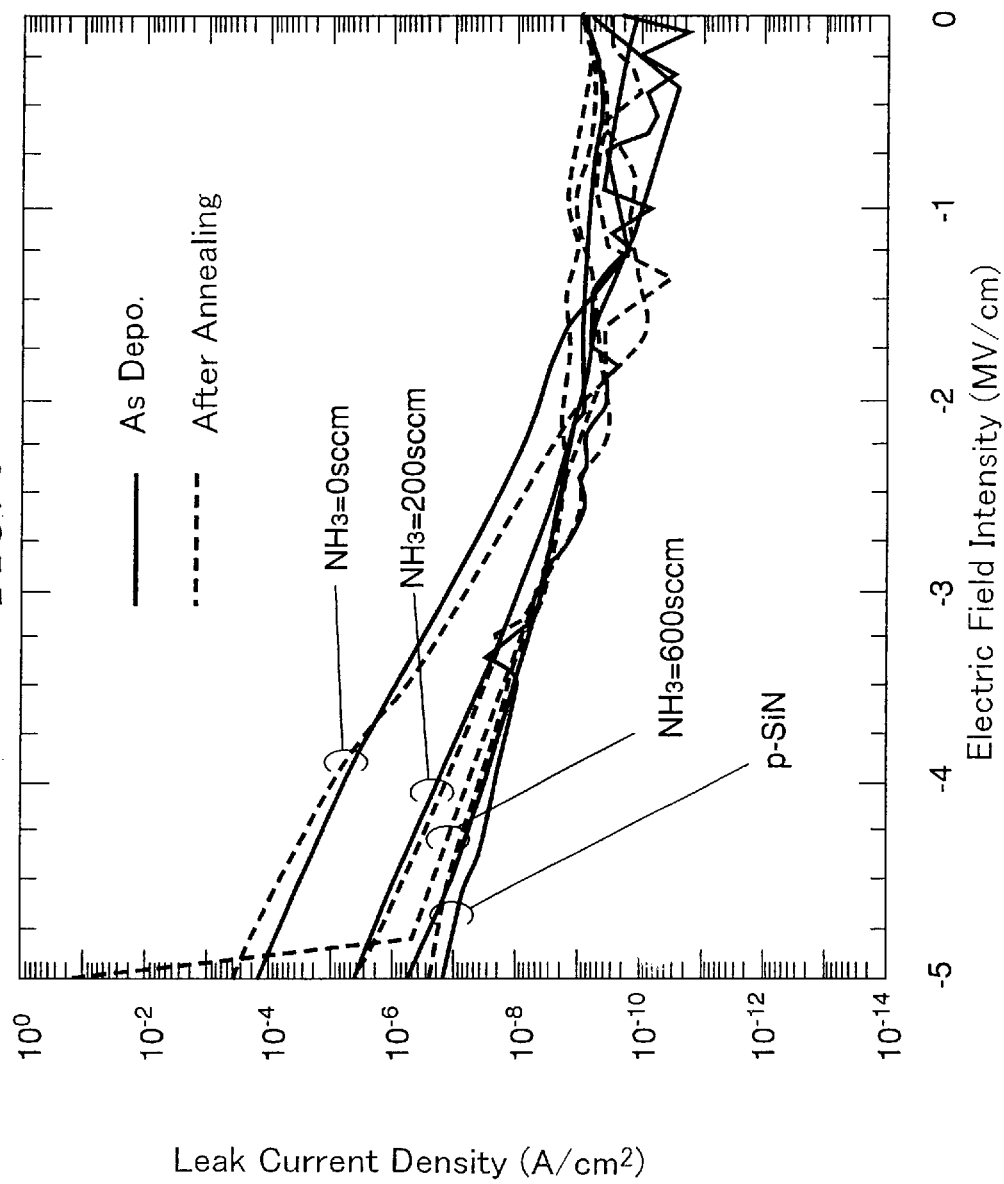
FIG. 6 is another graph showing comparison of leakage current densities immediate after deposition and after annealing with regard to the insulating film formed by the plasma enhanced CVD method using film forming gas, according to the first embodiment of the present invention.
Figure 7:
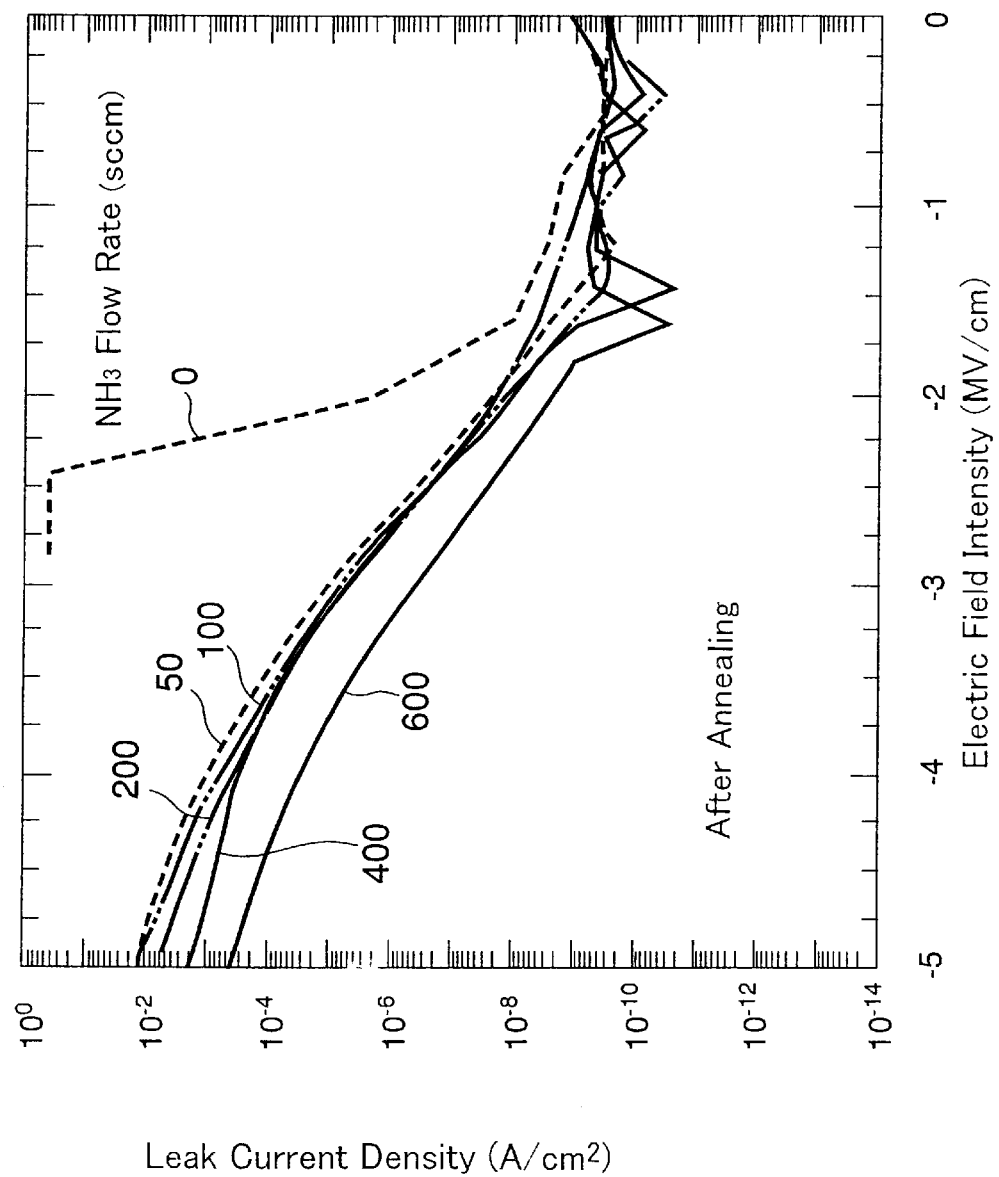
FIG. 7 is a graph showing measurement result of the leakage current densities after annealing with regard to the insulating film formed by the plasma enhanced CVD method using film forming gas, according to a comparative example.

The results are shown in FIGS. 5 to 7. FIG. 5 is the graph showing the measurement result of the leakage current density immediately after deposition and after annealing with regard to the PE-CVD $SiO_2$ film (sample 1 for test) deposited by the first film forming gas according to the present invention and the comparative sample 2. In the drawing, the solid lines show the measurement values of the leakage current density immediately after deposition, and the dotted lines show the measurement values of the leakage current density after annealing. FIG. 6 is the graph showing the measurement result of the leakage current density immediately after deposition and after annealing with regard to the sample for inspection 2 and the comparative sample 2. In the drawing, the solid lines show the measurement values of the leakage current density immediately after deposition, and the dotted lines show the measurement values of the leakage current density after annealing.

FIG. 7 is the graph showing the measurement result of the leakage current density after annealing with regard to the comparative sample 1.

In FIGS. 5 to 7, the axis of ordinate shows a leakage current density (A/cm$^2$) expressed in the logarithmic scale, and the axis of abscissas shows a electric field intensity (MV/cm) expressed in the linear scale.

The fluctuation of the leakage current density before and after annealing shows the movement of copper in the film, and the p-SiN film as the comparative sample 2 shows an excellent result with regard to the leakage current density immediate after deposition and with regard to suppressing an increase of the leakage current density after annealing according to FIGS. 5 to 7.

Further, it was made clear that the use of the film forming gas containing $N_2O$ or $NH_3$ could prevent an increase of the leakage current density after annealing. In other words, it was made clear that the use of such gas was effective for improving denseness of film.

On the other hand, the leakage current density immediately after annealing is the smallest in the sample 2 for test in FIG. 6, followed by FIG. 5 and FIG. 7 in this order. In other words, other than the sample 2 in FIG. 6, the good result was not necessarily brought to even by the sample (comparative sample 1 shown in FIG. 7) in which $NH_3$ was added to the silicon-containing gas (HMDSO). It was made clear that adding $NH_3$ to mixed gas of the silicon-containing gas (HMDSO) and the oxygen-containing gas ($N_2O$) effectively reduces the leakage current density immediately after deposition.

As described above, according to the first embodiment, it was found out regarding the electric power of the two (high and low) frequencies applied to the film forming gas that the PE-CVD $SiO_2$ film 23 by low frequency electric power was denser although it had higher relative dielectric constant. Moreover, it was made clear that the denseness is further improved if $NH_3$ was added to the film forming gas, particularly containing the oxygen-containing gas.

Further, it was also made clear that the PE-CVD $SiO_2$ film 23 by high frequency electric power was poorer in denseness although it was lower in relative dielectric constant in comparison to the sample by the low frequency electric power.

Accordingly, in the case of forming the barrier insulating film that contacts the wiring consisting mainly of a copper film, the frequency of the electric power applied to the film forming gas should be set to the low frequency (first frequency (f1)). In the case of forming the main insulating film having the low relative dielectric constant on the barrier insulating film, the frequency of the electric power applied to the same film forming gas should be set to the high frequency (second frequency (f2)).

Thus, by only adjusting the frequency of the electric power applied to the film forming gas, the present invention enables a continuous formation of a series of insulating films as the inter layer insulating film on the wiring or the like that mainly consists of copper film. Accordingly, improvement of throughput can be achieved.

Second Embodiment

Next, description will be made for the semiconductor device and the manufacturing method thereof according to the second embodiment of the present invention with reference to FIGS. 8A to 8D.

Figure 8A:
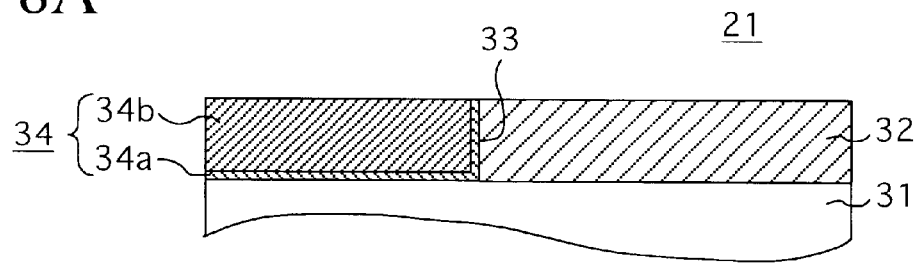
FIGS. 8A to 8D are cross-sectional views showing the semiconductor device and its manufacturing method, according to a second embodiment of the present invention.

FIG. 8A is the cross-sectional view showing the manufacturing method of the semiconductor device according to the second embodiment of the present invention. HMDSO+$N_2O$ is used as the film forming gas for an inter wiring layer insulating film 34.

Firstly, a lower wiring buried insulating film 32 that consists of an $SiO_2$ film having the film thickness of about 1 µm is formed on a substrate (substrate subject to deposition) 31.

Subsequently, the lower wiring buried insulating film 32 is etched to form the wiring groove, followed by forming a TaN film 34a as a copper diffusion preventing film on an inner surface of a wiring groove 33. Then, after forming a copper seed layer (not shown) on the surface of the TaN film 34a by a sputtering method, a copper film 34b is buried thereon by a plating method. Thereafter, the copper film 34b and the TaN film 34a protruded from the wiring groove 33 are polished by a CMP method (Chemical Mechanical Polishing method) to make the surface flat. Thus, it results in formation of the lower wiring 34 made of the copper wiring 34b and the TaN film 34a.

Next, a inter wiring layer insulating film 35 that consists of the PE-CVD $SiO_2$ film having the film thickness of about 500 nm is formed by the plasma enhanced CVD method using HMDSO+$N_2O$. Detailed description will be made as follows.

Specifically, in order to form the inter wiring layer insulating film 35, the substrate subject to deposition 21 is introduced into the chamber 1 of the deposition apparatus 101 first and held by the substrate holding stage 3. Subsequently, the substrate subject to deposition 21 is heated while its temperature is kept at 375° C. HMDSO and $N_2O$ are introduced into the chamber 1 of the plasma enhanced deposition apparatus 101 shown in FIG. 1 at the flow rates of 50 scam and 200 sccm respectively, and the pressure is kept at 1.5 Torr. Then, the low frequency electric power of 150 W (corresponds to 0.18 W/cm$^2$) having the frequency of 380 kHz is applied to the lower electrode 3. Note that the high frequency electric power may not be applied to the upper electrode 2, or may be applied if necessary.

Figure 8B:
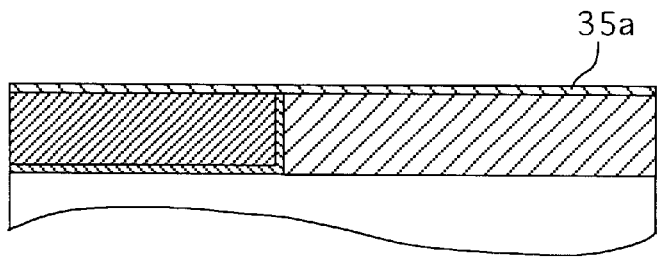

Thus, HMDSO and $N_2O$ are transformed into plasma. This status is maintained for a predetermined time to form a barrier insulating film 35a that consists of the PE-CVD $SiO_2$ film having the film thickness of about 100 nm as shown in FIG. 8B.

Figure 8C:
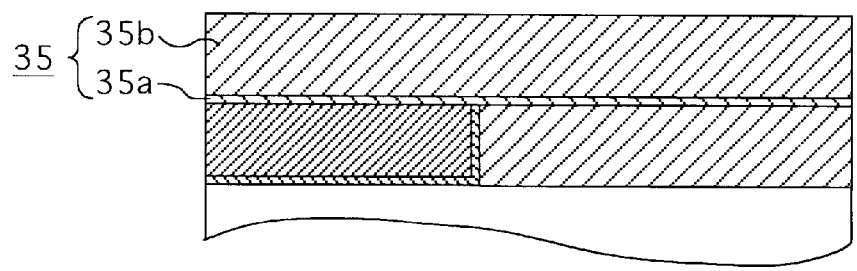

Then, the high frequency electric power of 250 W (corresponds to 0.3 W/cm$_2$) having the frequency of 13.56 MHz is applied to the upper electrode 2 while the same combination of reactive gases is used as the film forming gas and the same gas flow rate and the gas pressure were maintained. Note that the low frequency electric power is not applied to the lower electrode 3. The gas pressure is adjusted to 1.5 Torr and deposition is performed under the same plasma excitation conditions. This status is maintained for a predetermined time to form a main insulating film 35b that consists of the PE-CVD $SiO_2$ film having the film thickness of about 400 nm as shown in FIG. 8C.

Thus, it results in formation of the inter wiring layer insulating film 35 that consists of the barrier insulating film 35a and the main insulating film 35b.

Figure 8D:
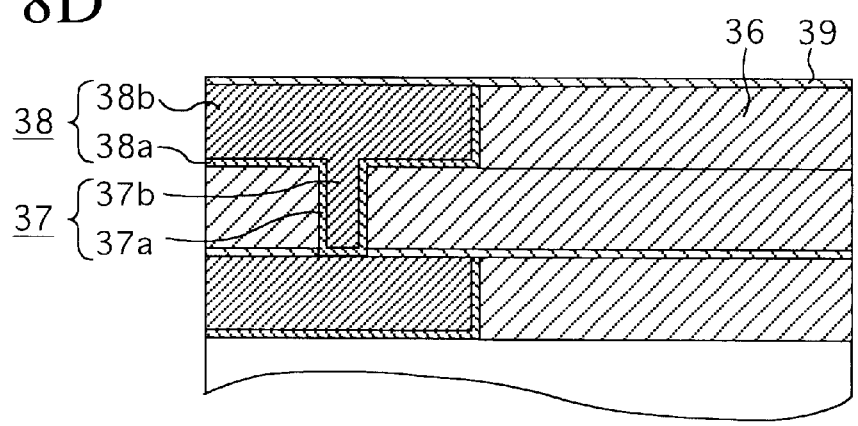

Subsequently, an upper wiring buried insulating film 36 that consists of the $SiO_2$ film having the film thickness of about 1 µm is formed, as shown in FIG. 8D, on the inter wiring layer insulating film 35 by the same method as that for the formation of the $SiO_2$ film 32.

Next, a connection conductor 37 and an upper wiring 38, which mainly consist of the copper films (37b, 38b), are formed by a well-known dual-damascene method. Note that reference numerals 37a and 38a in the drawing denote the TaN film.

Next, a barrier insulating film 39 is formed on the entire surface by the PE-CVD method using the same deposition condition as the one for formation of the barrier insulating film 35a among the inter wiring layer insulating film 35. Thus, the semiconductor device is completed.

As described above, according to the second embodiment, in the manufacturing method of the semiconductor device in which the inter wiring layer insulating film 35 is sandwiched between the lower wiring buried insulating film 32, in which the lower wiring 34 is buried, and the upper wiring buried insulating film 36, in which the upper wiring 38 is buried, then the barrier insulating film 35a and the main insulating film 35b are formed using the same film forming gas and changing the frequency of plasma generating electric power through the plasma enhanced CVD method. Specifically, the electric power having the first frequency (f1) of 380 kHz is applied to the film forming gas (first film forming gas) containing HMDSO+$N_2O$ to transform the film forming gas into plasma, and thus the barrier insulating film 35a is formed. Next, the electric power having the second frequency (f2) of 13.56 MHz higher than the first frequency (f1) is applied to the same film forming gas (second film forming gas) to transform the film forming gas into plasma, and thus the main insulating film 35b having the low relative dielectric constant is formed.

The denser insulating film can be formed when the electric power having the low frequency of 1 MHz or less transforms the film forming gas containing HMDSO+$N_2O$ into plasma to cause reaction for deposition. Thus, it can prevent diffusion of copper. Further, the main insulating film having low relative dielectric constant can be formed when the electric power having the high frequency of 1 MHz or more transforms the same film forming gas into plasma to cause reaction for deposition.

Thus, by only adjusting the frequency of the plasma generating electric power while using the same film forming gas, there can be attained a continuous formation of the multi-layer insulating films (35a, 35b), which have ability required for the inter wiring layer insulating film 35 on the lower wiring 34 that mainly consists of a copper film. In other words, improvement of throughput can be achieved in the deposition of the inter wiring layer insulating film 35 on the lower wiring 34.

As in the foregoing, although the present invention has been described in detail based on the embodiments, the scope of the present invention is not limited to the examples specifically shown in the embodiments. Changes of the foregoing embodiments within the scope of the gist of the present invention are included in the scope of the present invention.

For example, the alkyl compound having another siloxane bond described in the first embodiment can be used as the silicon-containing gas instead of HMDSO used in the second embodiment.

Furthermore, the first film forming gas for depositing the barrier insulating film 35a may be gas mixture in which any one of the nitrogen-containing gases such as ammonia ($NH_3$) and nitrogen ($N_2$) is added to the silicon-containing gas and the oxygen-containing gas. Thus, the barrier ability against copper of the deposited insulating film can be improved.

Still further, the second film forming gas for forming the main insulating film 35b may be gas mixture in which any one of methylcyclohexane ($CH_3C_6H_{11}$) and cyclohexane ($C_6H_{12}$) is added to the silicon-containing gas and the oxygen-containing gas. The addition of these compounds results in further increase of porosity of film and further reduction of the relative dielectric constant.

The inert gas containing either one of argon (Ar) or nitrogen ($N_2$) instead of helium (He) can be added to either one of the first or second film forming gas. Thus, the film forming gas can be diluted while maintaining the adhesion between the lower wiring 34 consisting mainly of copper film and the barrier insulating film 35a.

Further, although a wiring consisting of the TaN film as a barrier film and the copper film as a main wiring thereon is used as the wiring consisting mainly of copper film, a wiring of another structure that mainly consists of copper film or a wiring that consists of only copper film may be used.

In addition, although the wiring formed by the damascene method is used as the wiring mainly consisting of copper film, a wiring fabricated by another manufacturing method may be used. Specifically, the present invention may use the insulating film that coats the wiring mainly consisting of copper film or to the inter wiring layer insulating film sandwiched between the wirings mainly consisting of copper film.

As described above, according to the present invention, by only adjusting the frequency of the electric power for transforming the film forming gas into plasma while using the same film forming gas, there can be attained a continuous formation of the barrier insulating film which has sufficient ability to prevent diffusion of copper, and the main insulating film having sufficiently low relative dielectric constant.

Therefore, the present invention is capable of forming the multi-layer insulating films, which have ability required for the inter layer insulating film on the wiring mainly consisting of copper film, while improving throughput.

What is claimed is:

1. A manufacturing method of a semiconductor device, comprising the steps of:

forming a barrier insulating film on a substrate subject to deposition, wherein an electric power having a first frequency (f1) is applied to a first film forming gas that contains at least a silicon-containing gas and an oxygen-containing gas so as to transform said first film forming gas into plasma and thus cause reaction of said first film forming gas; and forming a main insulating film having low relative dielectric constant on said barrier insulating film, wherein an electric power having a second frequency (f2) higher than said first frequency (f1) is applied to a second film forming gas that contains at least a silicon-containing gas and an oxygen-containing gas so as to transform said second film forming gas into plasma and thus cause reaction of said second film forming gas.

2. The manufacturing method of a semiconductor device according to claim 1, wherein said first and second film forming gases are transformed into plasma by parallel plate electrodes which consist of a first electrode holding said substrate subject to deposition and a second electrode opposing to the first electrode, the electric power having said first frequency (f1) is applied to said first electrode in the step of forming said barrier insulating film, and the electric power having said second frequency (f2) is applied to said second electrode in the step of forming said main insulating film.

3. The manufacturing method of a semiconductor device according to claim 2, wherein the electric power having said first frequency (f1) is a low frequency electric power having frequency of 100 kHz or more and 1 MHz or less, and the electric power having said second frequency (f2) is a high frequency electric power having frequency of 1 MHz or more.

4. The manufacturing method of a semiconductor device according to claim 1, wherein said silicon-containing gas is alkyl compound having siloxane bond, and said oxygen-containing gas is any one of $N_2O$, $H_2O$ and $CO_2$, out of said first film forming gas and said second film forming gas.

5. The manufacturing method of a semiconductor device according to claim 4, wherein said alkyl compound having siloxane bond is any one of hexamethyldisiloxane (HMDSO:$(CH_3)_3Si$—O—Si$(CH_3)_3$), octamethylcyclotetrasiloxane (OMCTS: $((CH_3)_2)_4Si_4O_4$)

[Chemical formula 3]

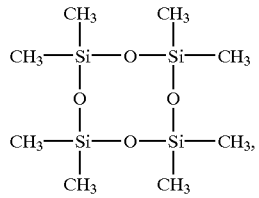

and tetramethylcyclotetrasiloxane (TMCTS:$(CH_3H)_4Si_4O_4$)

[Chemical formula 4]

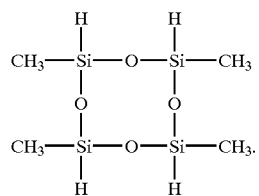

6. The manufacturing method of a semiconductor device according to claim 1, wherein at least one of said first film forming gas and said second film forming gas contains any one of helium (He), argon (Ar) and nitrogen ($N_2$).

7. The manufacturing method of a semiconductor device according to claim 1, wherein said first film forming gas contains any one of ammonia ($NH_3$) and nitrogen ($N_2$) in addition to said silicon-containing gas and said oxygen-containing gas.

8. The manufacturing method of a semiconductor device according to claim 1, wherein said second film forming gas contains any one of methylcyclohexane ($CH_3C_6H_{11}$) and cyclohexane ($C_6H_{12}$) in addition to said silicon-containing gas and said oxygen-containing gas.

9. The manufacturing method of a semiconductor device according to claim 1, wherein said first film forming gas and said second film forming gas are mixed gases containing the same gas.

10. The manufacturing method of a semiconductor device according to claim 1, wherein a wiring that mainly consists of copper film is exposed on a surface of said substrate.

11. The manufacturing method of a semiconductor device according to claim 10, wherein said barrier insulating film and said main insulating film constitute an inter layer dielectric sandwiched between the wirings that mainly consist of copper film.

* * * * *